United States Patent
Lee

(10) Patent No.: US 11,443,808 B2
(45) Date of Patent: Sep. 13, 2022

(54) SEMICONDUCTOR MEMORY DEVICE AND METHOD OF OPERATING THE SEMICONDUCTOR MEMORY DEVICE

(71) Applicant: SK hynix Inc., Icheon-si (KR)

(72) Inventor: Jong Hoon Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 67 days.

(21) Appl. No.: 17/080,262

(22) Filed: Oct. 26, 2020

(65) Prior Publication Data

US 2021/0366551 A1 Nov. 25, 2021

(30) Foreign Application Priority Data

May 19, 2020 (KR) ........................ 10-2020-0060007

(51) Int. Cl.
| | | |
|---|---|---|
| G11C 16/10 | (2006.01) | |
| G11C 16/26 | (2006.01) | |
| G11C 16/34 | (2006.01) | |
| G11C 16/30 | (2006.01) | |
| G11C 16/08 | (2006.01) | |

(52) U.S. Cl.
CPC .............. *G11C 16/10* (2013.01); *G11C 16/08* (2013.01); *G11C 16/26* (2013.01); *G11C 16/30* (2013.01); *G11C 16/3459* (2013.01)

(58) Field of Classification Search
CPC ......... G11C 16/08; G11C 16/30; G11C 16/32; G11C 16/0483; G11C 16/3459; G11C 16/26; G11C 16/10
See application file for complete search history.

(56) References Cited

U.S. PATENT DOCUMENTS 10,153,051 B1 * 12/2018 Chen ................. G11C 16/0483
2015/0146488 A1 * 5/2015 Lim ........................ G11C 16/26
365/185.11

FOREIGN PATENT DOCUMENTS

KR 1020130072668 A 7/2013
KR 101802815 B1 12/2017

* cited by examiner

*Primary Examiner* — Uyen Smet

(74) *Attorney, Agent, or Firm* — William Park & Associates Ltd.

(57) ABSTRACT

A semiconductor memory device includes a memory cell array, a peripheral circuit, a current sensing circuit, and control logic. The memory cell array includes a plurality of memory cells. The peripheral circuit performs a program operation on selected memory cells connected to a selected word line among the plurality of memory cells. The current sensing circuit generates a pass signal or a fail signal by performing a current sensing operation on the selected memory cells. The control logic receives the pass signal or the fail signal and controls an operation of the peripheral circuit and the current sensing circuit. The control logic controls the current sensing circuit and the peripheral circuit to perform the current sensing operation and an operation of applying a program pulse to the selected word line based on a program progress state of the selected memory cells.

13 Claims, 18 Drawing Sheets

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2020-0060007, filed on May 19, 2020, in the Korean Intellectual Property Office, the entire disclosure of which is incorporated herein by reference.

BACKGROUND

1. Technical Field

The present disclosure relates to an electronic device, and more particularly, to a semiconductor memory device and a method of operating the semiconductor memory device.

2. Related Art

A memory device may be formed in a two-dimensional structure in which strings are horizontally arranged on a semiconductor substrate, or in a three-dimensional structure in which the strings are vertically stacked on the semiconductor substrate. A three-dimensional memory device is a memory device designed in order to resolve a limit of integration of a two-dimensional memory device, and may include a plurality of memory cells that are vertically stacked on a semiconductor substrate.

SUMMARY

A semiconductor memory device according to an embodiment of the present disclosure may include a memory cell array, a peripheral circuit, a current sensing circuit, and control logic. The memory cell array may include a plurality of memory cells. The peripheral circuit may perform a program operation on selected memory cells connected to a selected word line among the plurality of memory cells. The current sensing circuit may generate a pass signal or a fail signal by performing a current sensing operation on the selected memory cells. The control logic may receive the pass signal or the fail signal and controls an operation of the peripheral circuit and the current sensing circuit. The control logic may control the current sensing circuit and the peripheral circuit to perform the current sensing operation and an operation of applying a program pulse to the selected word line based on a program progress state of the selected memory cells.

In accordance with a method of operating a semiconductor memory device according to another embodiment of the present disclosure, selected memory cells are programmed. The method may include applying a program pulse to a selected word line connected to the selected memory cells, applying a verify voltage to the selected word line, and performing a current sensing operation and an operation of applying a program pulse based on a program progress state for the selected memory cells.

DETAILED DESCRIPTION

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and the descriptions are not limited to the embodiments described in the present specification or application.

An embodiment of the present disclosure may provide a semiconductor memory device having improved program speed and stability.

Another embodiment of the present disclosure may provide a method of operating a semiconductor memory device having improved program speed and stability.

Figure 1:
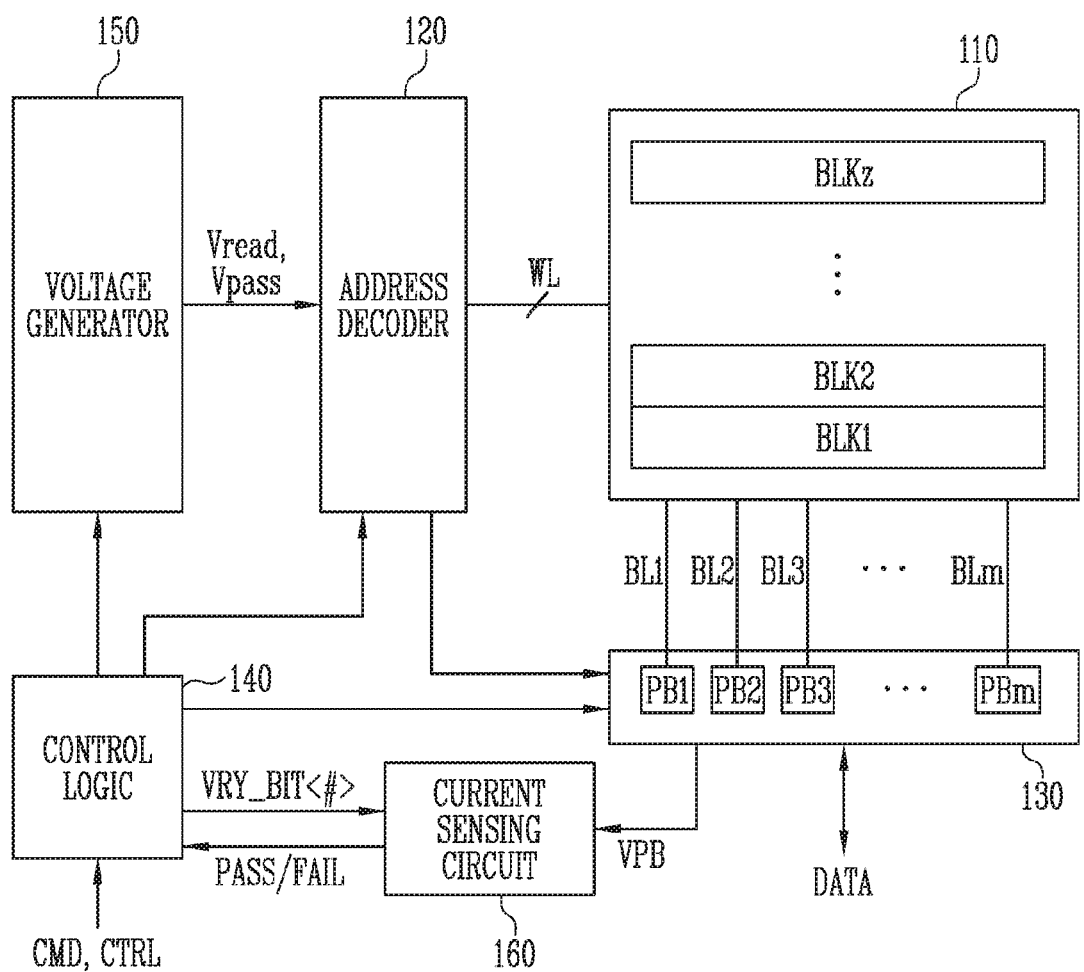
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, control logic 140, a voltage generator 150, and a current sensing circuit 160. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 may be configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130. In the present specification, memory cells connected to one word line may be referred to as a "physical page".

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change of an amount of a current flowing according to a programmed state of a corresponding memory cell through a sensing node while continuously supplying a sensing current to the bit lines connected to the memory cells, and latches the sensed change as sensing data. The read and write circuit 130 operates in response to page buffer control signals output from the control logic 140. In the present specification, the write operation of the write circuit may be used as the same meaning as the program operation on selected memory cells.

During the read operation, the read and write circuit 130 senses data of the memory cell, temporarily stores read data, and outputs data DATA to the input/output buffer (not shown) of the semiconductor memory device 100. As an example of an embodiment, the read and write circuit 130 may include a column selection circuit, and the like, in addition to the page buffers (or page registers).

The control logic 140 is connected to the address decoder 120, the read and write circuit 130, the voltage generator 150, and the current sensing circuit 160. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node pre-charge potential level of the plurality of page buffers PB1 to PBm. The control logic 140 may control the read and write circuit 130 to perform the read operation of the memory cell array 110.

Meanwhile, the control logic 140 may determine whether a verification operation on a specific target program state is passed or failed in response to a pass signal PASS or a fail signal FAIL received from the current sensing circuit 160.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The current sensing circuit 160 may generate a reference current in response to a permission bit VRY_BTI<#> received from the control logic 140 during the verification operation, and may output the pass signal PASS or the fail signal FAIL by comparing a reference voltage generated by the reference current with a sensing voltage VPB received from the page buffers PB1 to PBm included in the read and write circuit 130.

For example, the current sensing circuit 160 may determine whether the verification operation corresponding to the specific target program state is completed, by comparing a voltage generated according to a value of a bit line sense latch included in each of the page buffers PB1 to PBm with the reference voltage generated by the reference current. The bit line sense latch included in each of the page buffers PB1 to PBm will be described later with reference to FIG. 6.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 2:
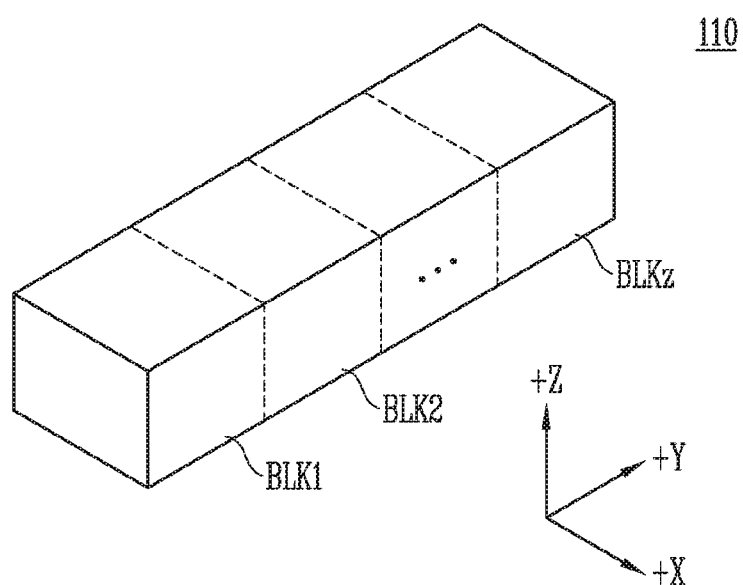
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 3 and 4.

Figure 3:
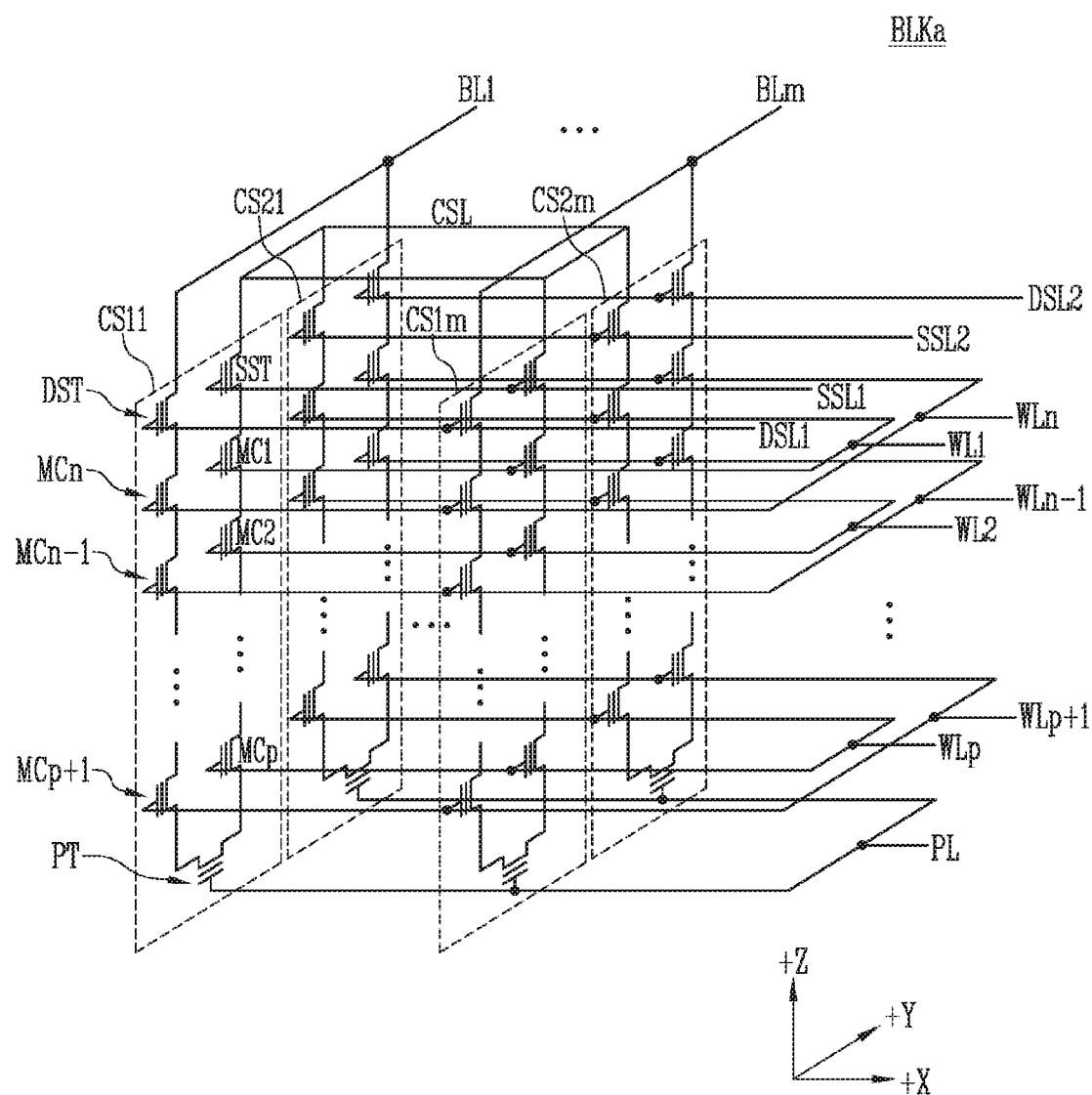
FIG. 3 is a circuit diagram illustrating any one memory block BLKa of memory blocks BLK1 to BLKz of FIG. 2.

FIG. 3 is a circuit diagram illustrating any one memory block BLKa of the memory blocks BLK1 to BLKz of FIG. 2.

Referring to FIG. 3, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 3, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 3, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

Figure 4:
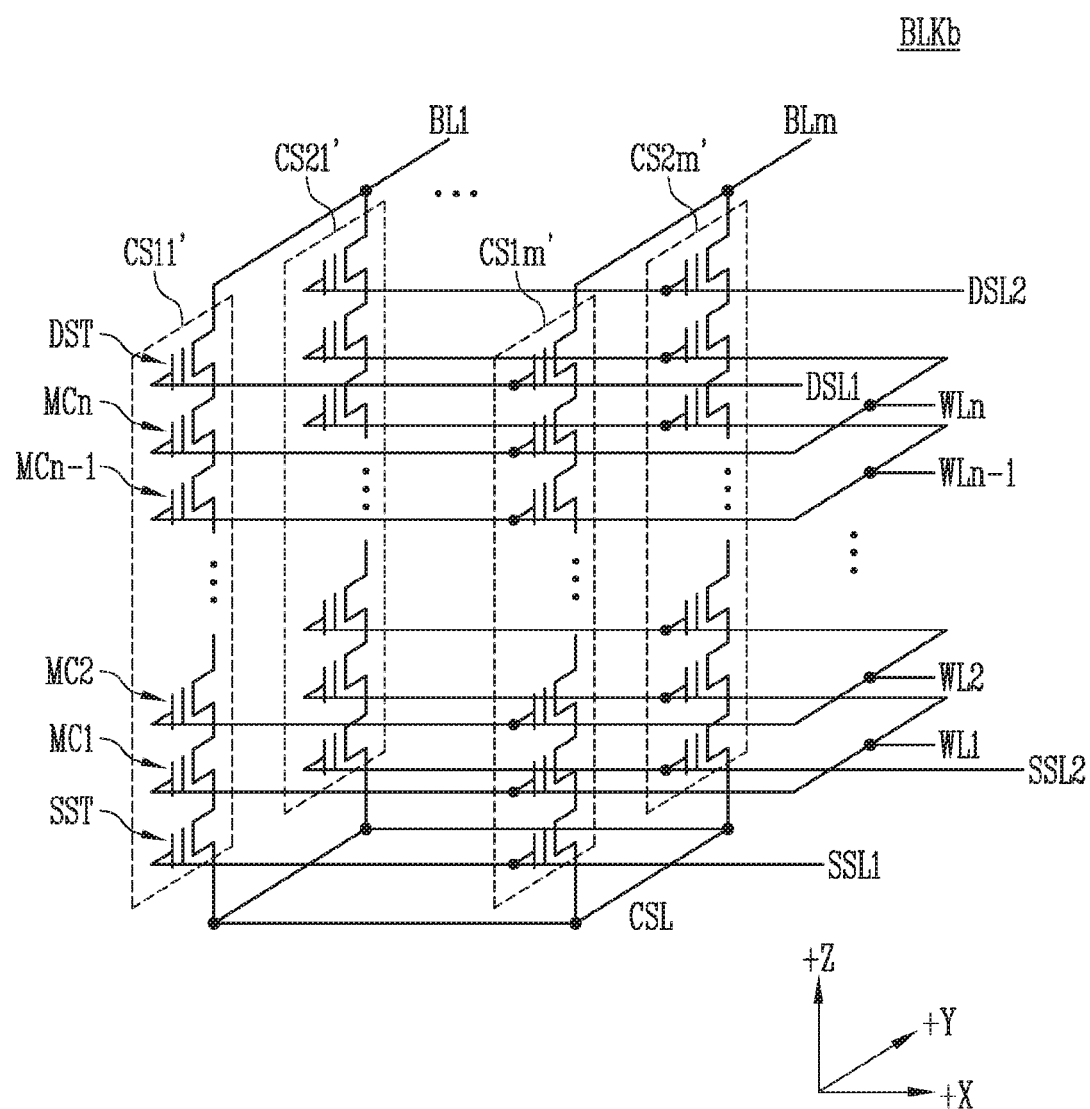
FIG. 4 is a circuit diagram illustrating another embodiment of any one memory block BLKb of the memory blocks BLK1 to BLKz of FIG. 2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

FIG. 4 is a circuit diagram illustrating another embodiment of any one memory block BLKb of the memory blocks BLK1 to BLKz of FIG. 2.

Referring to FIG. 4, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 4 has an equivalent circuit similar to the memory block BLKa of FIG. 3 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 5:
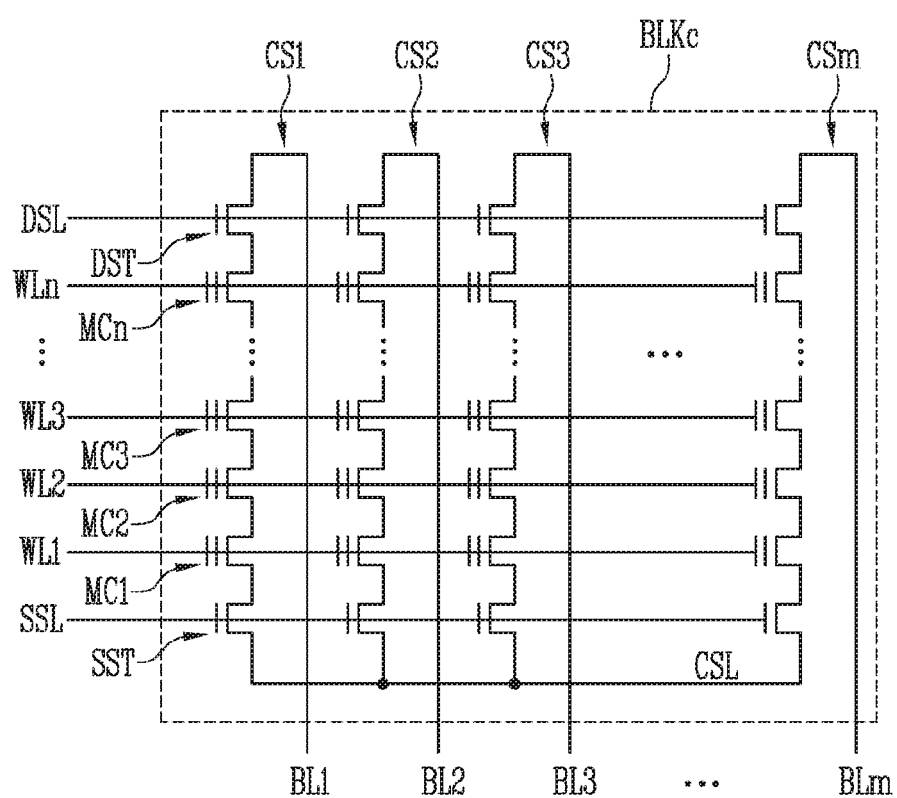
FIG. 5 is a circuit diagram illustrating an embodiment of any one memory block BLKc of the memory blocks BLK1 to BLKz included in the memory cell array 110 of FIG. 1.

FIG. 5 is a circuit diagram illustrating an embodiment of any one memory block BLKc of the memory blocks BLK1 to BLKz included in the memory cell array 110 of FIG. 1.

Referring to FIG. 5, the memory block BKLc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

As another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As described above, the memory cells connected to one word line may configure one physical page. In the example of FIG. 5, among the memory cells belonging to the memory block BLKc, m memory cells connected to any one of the plurality of word lines WL1 to WLn configure one physical page.

As shown in FIGS. 2 to 4, the memory cell array 110 of the semiconductor memory device 100 may be configured in a three-dimensional structure, but may also be configured in a two-dimensional structure as shown in FIG. 5.

Figure 6:
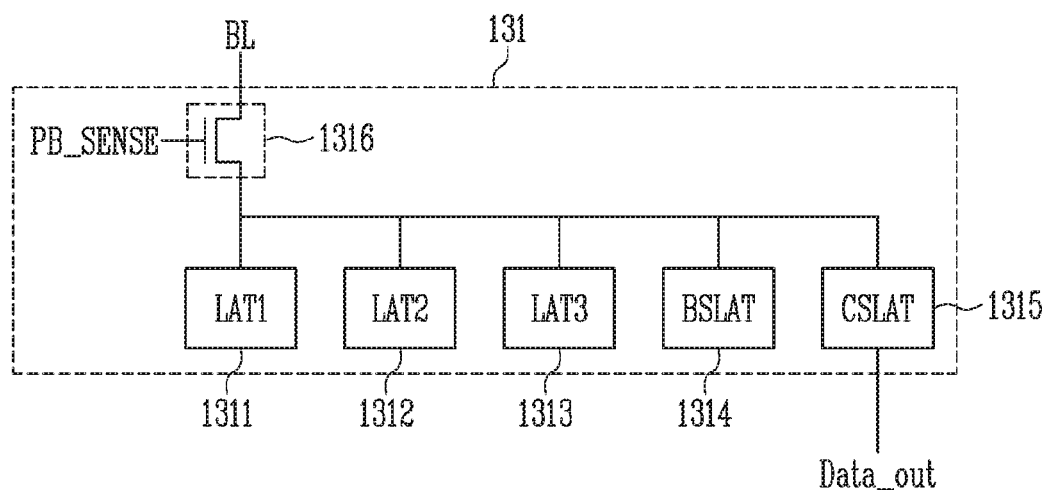
FIG. 6 is a diagram schematically illustrating a page buffer according to an example of an embodiment.

FIG. 6 is a diagram schematically illustrating a page buffer 131 according to an example of an embodiment.

During a read or program verify operation, data stored in a memory cell or a threshold voltage of the memory cell is sensed through a bit line BL. The page buffer 131 may include a bit line sense latch BSLAT; 1314 for storing a sensing result. In addition, the bit line sense latch 1314 may be utilized to determine a program permission voltage or a program inhibit voltage applied to the bit line BL during a program execution operation.

The page buffer 131 may include a plurality of data latches 1311, 1312, and 1313 for storing externally input program data during a program operation. For example, in the embodiment shown in FIG. 6, the page buffer 131 may store 3 bits of data. In this case, the data latch LAT1 or 1311 may store a most significant bit (MSB), the data latch LAT2 or 1312 may store a central significant bit (CSB), and the data latch LAT3 or 1313 may store a least significant bit (LSB). The data latches 1311, 1312, and 1313 may maintain stored program data until program of the memory cell is completed.

In addition, a cache latch CSLAT; 1315 may receive data, which is read from the memory cell during the read operation, from the bit line sense latch 1314 and output the data to an outside of the page buffer 131 through a data output line Data_out.

Meanwhile, the page buffer 131 may include a bit line connection transistor 1316 that controls connection between the bit line BL and the bit line sense latch 1314 and between the data latches 1311, 1312, and 1313, and the cache latch 1315. The bit line connection transistor 1316 is controlled by a bit line connection signal PB_SENSE. For example, when reading the data from the memory cell, the bit line connection transistor 1316 is turned on to electrically connect the bit line BL and the bit line sense latch 1314. In addition, when transmitting the data stored in the bit line sense latch 1314 to the cache latch 1315, the bit line connection transistor 1316 may be turned off.

In a verify process during the program operation of the memory cell, a value indicating whether the threshold voltage of the memory cell connected to a corresponding bit line BL is greater than a verify voltage corresponding to a target state may be stored in the bit line sense latch 1314. For example, when the threshold voltage of the memory cell connected to the bit line BL is less than the verify voltage corresponding to the target state, a value of "0" may be stored in the bit line sense latch 1314. While the value of "0" is stored in the bit line sense latch 1314, the program permission voltage is applied to the bit line BL when a program pulse is applied. Meanwhile, as a program process progresses, when the threshold voltage of the memory cell connected to the bit line BL is greater than the verify voltage corresponding to the target state, a value of "1" may be stored in the bit line sense latch 1314. When the value of "1" is stored in the bit line sense latch 1314, the value of the bit line sense latch 1314 is maintained as "1" in a subsequent program loop, and the program inhibit voltage is applied to the bit line BL when the program pulse is applied. Meanwhile, since the threshold voltage of the memory cell corresponding to an erase state E is not required to be increased, the bit line sense latch 1314 of the page buffer 131 connected to the memory cells corresponding to the erase state E may have a value of "1" from a program beginning.

Therefore, whether the memory cell connected to the bit line BL of the page buffer 131 is programmed to the target program state may be determined by the value of the bit line sense latch 1314. The current sensing circuit 160 performs a current sensing operation based on the value stored in the bit line sense latch 1314 of the page buffer 131. Therefore, the current sensing circuit 160 may determine whether the verify operation corresponding to the specific target program state is completed.

Figure 7:
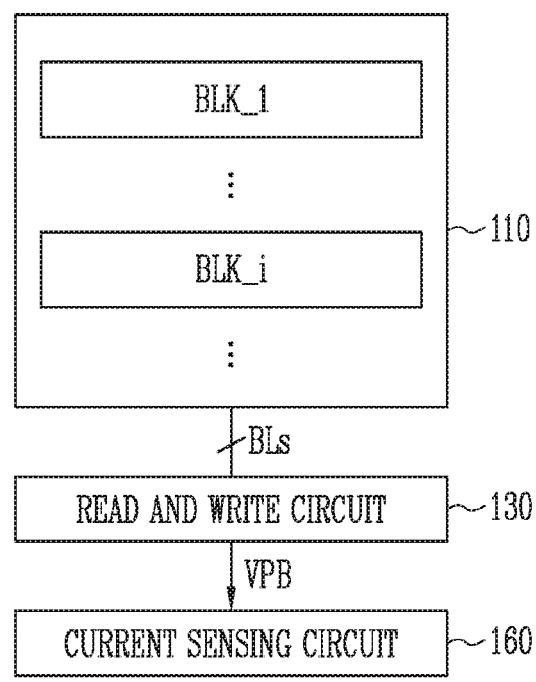
FIG. 7 is a block diagram illustrating a memory cell array, a read and write circuit, and a current sensing circuit of a semiconductor memory device.

FIG. 7 is a block diagram illustrating a memory cell array, a read and write circuit, and a current sensing circuit of a semiconductor memory device.

Referring to FIG. 7, according to an embodiment, the memory cell array 110 of the semiconductor memory device 100 may include a plurality of memory blocks. Although not shown in FIG. 7, according to another embodiment of the present disclosure, a memory cell array of a semiconductor memory device may include a plurality of planes, and each of the planes may include a plurality of memory blocks.

The plurality of memory blocks included in the memory cell array 110 may be connected to the read and write circuit 130 through bit lines BLs. Meanwhile, the read and write circuit 130 may be connected to the current sensing circuit 160.

When an i-th memory block BLKi is selected as a program target, the semiconductor memory device 100 may perform a program operation on the selected i-th memory block BLKi.

While the program operation on the i-th memory block BLKi is performed, the current sensing circuit 160 may output a pass signal PASS or the fail signal FAIL by comparing a reference voltage generated by a reference current with a sensing voltage VPB received from page buffers included in the write circuit 130 for a verify operation of memory cells included in the i-th memory block BLKi. As described above, the operation of outputting the pass signal PASS or the fail signal FAIL for a specific program state of the memory cells based on the sensing voltage VPB by the current sensing circuit 160 may be referred to as a "current sensing operation". The current sensing operation for the specific program state will be described later with reference to FIG. 8.

According to the present disclosure, a program pulse may be applied to a selected word line of the selected i-th memory block BLKi by the read and write circuit 130. Meanwhile, the current sensing circuit 160 may perform the current sensing operation while the program pulse is applied to the selected word line. In an embodiment, in order to reduce a program time, the current sensing operation and an operation of applying the program pulse to the selected word line may be simultaneously performed. In another embodiment, the current sensing operation and the operation of applying the program pulse may be performed at different times. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Figure 8:
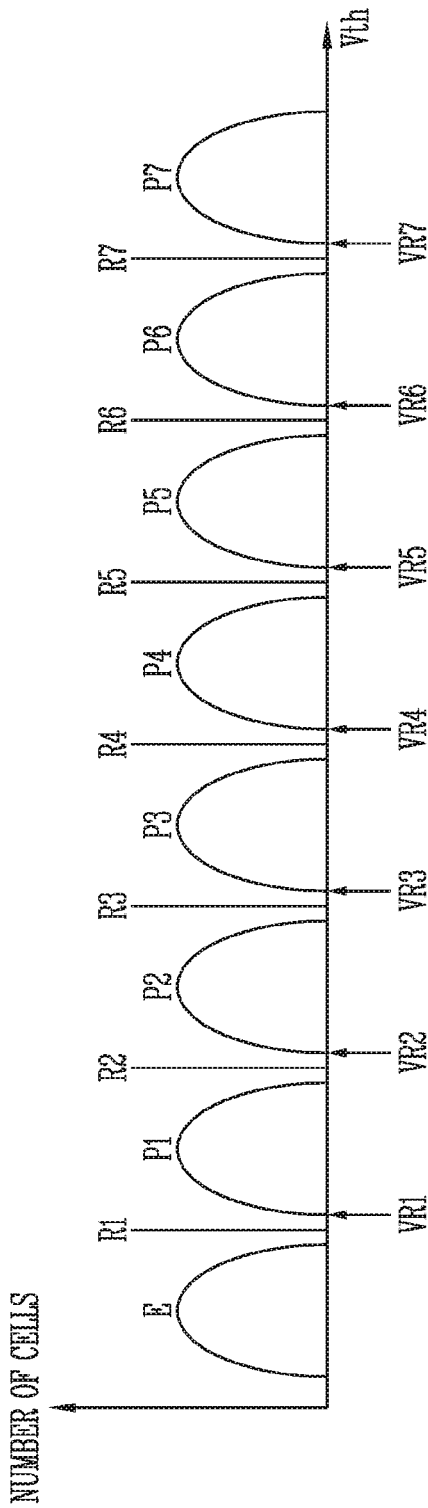
FIG. 8 is a graph illustrating target program states of a triple-level cell.

FIG. 8 is a graph illustrating target program states of a triple-level cell.

Referring to FIG. 8, the triple-level cell (TLC) has a total of eight threshold voltage states. The threshold voltage state of TLC includes an erase state E and first to seventh target program states P1 to P7. The erase state E and the first to seventh target program states P1 to P7 have corresponding bit codes. Various bit codes may be provided to the erase state E and the first to seventh target program states P1 to P7 as necessary.

Each of the threshold voltage states may be distinguished based on first to seventh read voltages R1 to R7. In addition, the first to seventh verify voltages VR1 to VR7 may be used to determine whether or not a program of the memory cells corresponding to each target program state of a program operation is completed.

For example, a second verify voltage VR2 is applied to a word line to verify memory cells corresponding to a second target program state P2 among memory cells included in a selected physical page. At this time, the memory cells corresponding to the second program state P2 may be distinguished by the data latches 1311, 1312, and 1313 shown in FIG. 6. For example, when a bit code corresponding to the second target program state is "101", a memory cell connected to a page buffer in which values of "1", "0", and "1" are stored in the data latches 1311, 1312, and 1313, respectively, is a memory cell to be programmed to the second target program state P2. Among the memory cells to be programmed to the second target program state P2, a memory cell in which the value of the bit line sense latch 1314 is "0" is a memory cell that is not yet programmed to the second target program state P2, and a memory cell in which the value of the bit line sense latch 1314 is "1" is a memory cell on which a program is completed to the second target program state P2.

The second verify voltage VR2 is applied to the word line and bit line BL is sensed, and when a threshold voltage of the memory cell is less than the second verify voltage VR2, the value of the bit line sense latch 1314 maintains "0". On the other hand, when the threshold voltage of the memory cell is greater than the second verify voltage VR2, the value of the bit line sense latch 1314 becomes "1". When the value of the bit line sense latch 1314 becomes "1", the program inhibit voltage is applied to the bit line BL connected to a corresponding memory cell in a subsequent program loop. Therefore, even though the program pulse is applied to the word line, the threshold voltage of the corresponding memory cell does not increase any more.

As described above, an operation of changing the value of the bit line sense latch 1314 corresponding to the second verify voltage VR2 is individually performed on memory cells to be programmed to the second target program state P2. Whether the program is completed on the memory cells to be programmed to the second target program state P2, that is, the determination whether the verification is passed/failed is performed by the current sensing circuit 160 of FIGS. 1 and 7.

In the example of FIG. 1, the current sensing circuit 160 determines whether the verification is passed or failed by comparing a reference voltage based on a reference current corresponding to the number of memory cells to be programmed to the second target program state P2 with a sensing voltage VPB based on a sensing current corresponding to the number of memory cells having the threshold voltage greater than the verify voltage VR2 among the memory cells to be programmed to the second target program state P2. That is, the current sensing circuit 160 determines whether the verification for the second target program state P2 is passed or failed by comparing the sensing voltage VPB determined according to the number of memory cells in which the value stored in the bit line sense latch BSLAT is "1" among the memory cells to be programmed to the second target program state P2 with the reference voltage.

As described above, the current sensing circuit may determine whether the verification is passed/failed for a specific target program state (for example, P2). As described above, among a plurality of target program states, an operation of determining whether the verification is passed/failed for the specific target program state may be referred to as a "current sensing operation".

Although the target program states of the triple-level cell are shown in FIG. 8, this is an example, and the plurality of memory cells included in the semiconductor memory device according to an embodiment of the present disclosure may be a multi-level cell (MLC). In still another embodiment, the plurality of memory cells included in the semiconductor memory device according to an embodiment of the present disclosure may be a quad-level cell. Hereinafter, the present disclosure will be described centering on the program operation of the triple-level cell. However, the present disclosure is not limited thereto, and the present disclosure may also be applied to a program of the quad-level cell or memory cells storing five bits or more data.

Figure 9:
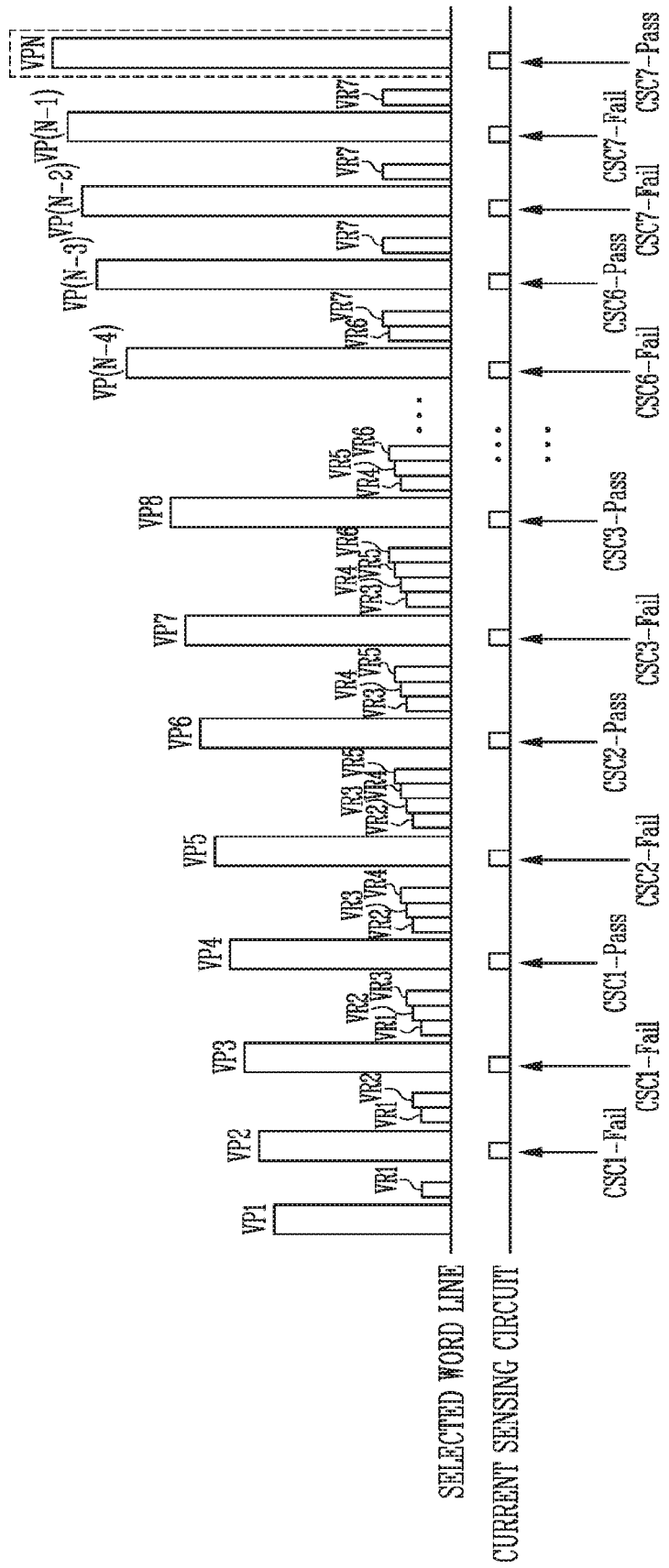
FIG. 9 is a diagram for describing a program operation according to an embodiment of the present disclosure.

FIG. 9 is a diagram for describing a program operation according to an embodiment of the present disclosure.

Referring to FIG. 9, a voltage applied to the selected word line while the program operation is progressed and the current sensing operation performed by the current sensing circuit are shown. The program operation shown in FIG. 9 includes a total of N program loops.

A first program pulse VP1 is applied to the word line selected in a first program loop. Thereafter, a first verify voltage VR1 is applied to the word line selected for a verify operation. The reason why only the first verify voltage VR1 is applied in the first program loop is that a possibility that a memory cell programmed to the second target program state P2 or higher than second target program state P2 exists is very low as a result of performing the first program loop. After applying the first verify voltage VR1, the value of the bit line sense latch 1314 of the page buffer connected to the memory cell having a threshold voltage higher than the first verify voltage VR1 among the memory cells to be programmed to the first target program state P1 may be changed to "1". On the other hand, the value of the bit line sense latch 1314 of the page buffer connected to the memory cell having a threshold voltage lower than the first verify voltage VR1 among the memory cells to be programmed to the first target program state P1 may maintain "0".

After applying the first verify voltage VR1, the current sensing operation CSC1 on the first target program state P1 is performed. Since only some of the memory cells to be programmed to the first target program state P1 are programmed, a verification with respect to the first target program state P1 is failed (CSC1-Fail).

Meanwhile, while the current sensing operation CSC1 on the first target program state P1 is performed, a second program pulse VP2 may be applied to the selected word line. That is, a second program loop may be started together with the current sensing operation CSC1 on the first target program state P1. As described above, simultaneously performing the current sensing operation of the first program loop and the operation of applying the program pulse of the second program loop is for reducing the entire program time. A program speed may be improved by simultaneously performing the current sensing operation of the first program loop and the operation of applying the program pulse of the second program loop.

After the second program pulse VP2 is applied, the first and second verify voltages VR1 and VR2 are applied to the selected word line. As the first verify voltage VR1 and the second verify voltage VR2 are applied, the value of the bit line sense latch 1314 of the page buffer connected to the memory cell of which the program is completed among the memory cells to be programmed to the first and second target program states P1 and P2 may be changed to "1". On the other hand, the value of the bit line sense latch 1314 of the page buffer connected to the memory cell of which the program is not completed among the memory cells to be programmed to the first and second target program states P1 and P2 may maintain "0".

The verify voltage applied in each program loop may be appropriately selected. For example, in the embodiment of FIG. 9, the second verify voltage VR2 is applied from the second program loop, but according to an embodiment, the second verify voltage VR2 may be applied from the first program loop, or the second verify voltage VR2 may be applied from the third program loop.

After the verify voltages VR1 and VR2 are applied, the current sensing operation CSC1 for the first target program state P1 is performed again. In the example of FIG. 9, although the second program pulse VP2 is applied, the program operation for the first target program state P1 is not completed. Therefore, the verification with respect to the first target program state P1 is failed in the second program loop (CSC1-Fail).

While the current sensing operation CSC1 for the first target program state P1 is performed, a third program pulse VP3 may be applied to the selected word line. That is, a third program loop may be started together with the current sensing operation CSC1 for the first target program state P1. After the third program pulse VP3 is applied, first to third verify voltages VR1 to VR3 are applied to the selected word line. As the first to third verify voltages VR1 to VR3 are applied, the value of the bit line sense latch 1314 of the page buffer connected to the memory cell of which the program is completed among the memory cells to be programmed to the first to third target program states P1 to P3 may be changed to "1". On the other hand, the value of the bit line sense latch 1314 of the page buffer connected to the memory cell of which the program is not completed among the memory cells to be programmed to the first to third target program states P1 to P3 may maintain "0".

After the verify voltages VR1, VR2, and VR3 are applied, the current sensing operation CSC1 for the first target program state P1 is performed again. In the example of FIG. 9, the program operation for the first target program state P1 is completed in the third program loop. Therefore, the verification with respect to the first target program state P1 is passed in the third program loop (CSC1-Pass).

While the current sensing operation CSC1 for the first target program state P1 is performed, a fourth program pulse VP4 may be applied to the selected word line. That is, a fourth program loop may be started together with the current sensing operation CSC1 for the first target program state P1. After the fourth program pulse VP4 is applied, verify voltages VR2, VR3, and VR4 are applied. Since the verification with respect to the first target program state P1 is passed in the third program loop, the first verify voltage VR1 may not be applied in the fourth program loop.

As the second to fourth verify voltages VR2 to VR4 are applied, the value of the bit line sense latch 1314 of the page buffer connected to the memory cell of which the program is completed among the memory cells to be programmed to the second to fourth target program states P2 to P4 may be changed to "1". On the other hand, the value of the bit line sense latch 1314 of the page buffer connected to the memory cell of which the program is not completed among the memory cells to be programmed to the second to fourth target program states P2 to P4 may maintain "0".

Since the verification is passed as a result of the current sensing operation CSC1 for the first target program state P1 in the third program loop, a current sensing operation CSC2 for the second target program state P2 is performed in the fourth program loop. In the example of FIG. 9, the program operation on the second target program state P2 is not completed in the fourth program loop. Therefore, the verification with respect to the second target program state P2 is failed in the fourth program loop (CSC1-Fail).

Thereafter, the verification is passed as a result of the current sensing operation CSC2 on the second target program state in a fifth program loop. Such a program loop is repeatedly performed. Description of sixth to (N−3)-th program is omitted.

In an (N−2)-th program loop, a current sensing operation CSC7 for a seventh target program state P7 is failed. While the current sensing operation CSC7 for the seventh target program state P7 is performed, an (N−1)-th program pulse VP(N−1) may be applied to the selected word line. That is, an (N−1)-th program loop may be started together with the current sensing operation CSC7 for the seventh target program state P7.

After the (N−1)-th program pulse VP(N−1) is applied, a seventh verify voltage VR7 is applied to the selected word line. As the seventh verify voltage VR7 is applied, the value of the bit line sense latch 1314 of the page buffer connected to the memory cell of which the program is completed among the memory cells to be programmed to the seventh target program state P7 may be changed to "1". On the other hand, the value of the bit line sense latch 1314 of the page buffer connected to the memory cell of which the program is not completed among the memory cells to be programmed to the seventh target program state P7 may maintain "0".

After the seventh verify voltage VR7 is applied, the current sensing operation CSC7 for the seventh target program state P7 is performed again. Meanwhile, an N-th program pulse VPN is applied to the selected word line together with the current sensing operation CSC7 for the seventh target program state P7.

In the example of FIG. 9, the program operation for the seventh target program state P7 is completed in the (N−1)-th program loop. Therefore, verification with respect to the seventh target program state P7 is passed in the (N−1)-th program loop (CSC7-Pass). Accordingly, the program operation is ended.

As described above, since the current sensing operation of the (N−1)-th program loop and the application of the N-th program pulse are simultaneously performed, the N-th program pulse VPN becomes an unnecessarily applied program pulse. Since a time required for applying the program pulse is relatively longer than a time required for performing the current sensing operation, a program time may be unnecessarily increased by applying the N-th program pulse VPN that is not required to be applied. Meanwhile, as the unnecessary N-th program pulse VPN is applied once more, an over program phenomenon in which threshold voltages of some of the memory cells to be programmed to the seventh target program state P7 is excessively high may occur. This may be a factor that hinders stability of the program operation of the semiconductor memory device.

According to a program method according to another embodiment of the present disclosure, the current sensing operation and the program pulse application operation are performed based on a program progress state. That is, the current sensing operation and the program pulse application operation are simultaneously performed or sequentially performed according to the program progress state. Accordingly, as shown in FIG. 9, at a time point at which the verification of the last target program state P7 is passed, the application of the unnecessary N-th program pulse VPN may be prevented. Therefore, the program speed of the semiconductor memory device may be improved, and the stability of the program operation may also be improved.

Figure 10:
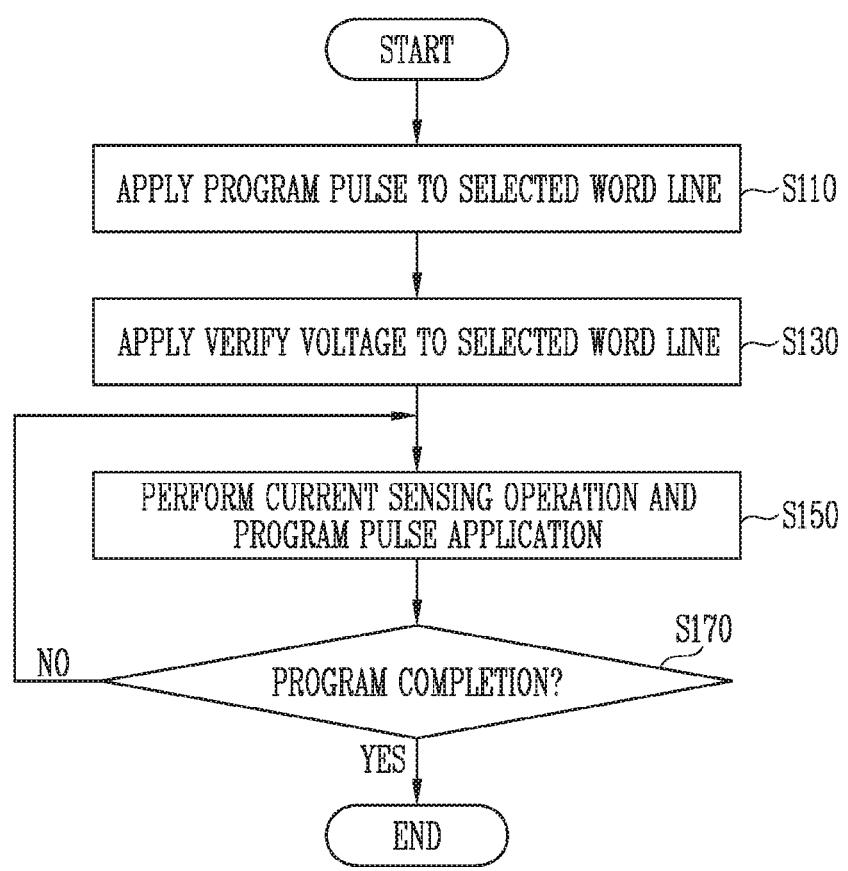
FIG. 10 is a flowchart illustrating a program method according to another embodiment of the present disclosure.

FIG. 10 is a flowchart illustrating a program method according to another embodiment of the present disclosure. Referring to FIG. 10, the program method according to another embodiment of the present disclosure includes applying a program pulse to a selected word line (S110), applying a verify voltage to the selected word line (S130), performing a current sensing operation and application of a program pulse based on a program progress state of selected memory cells (S150), and determining whether a program is completed (S170).

In step S110, the program pulse is applied to the selected word line. In step S110, the first program pulse of the first program loop may be applied.

In step S130, the verify voltage is applied to the selected word line. In step S130, verify voltages including at least the first verify voltage may be applied to the selected word line.

In step S150, the current sensing operation and the operation of applying the program pulse may be performed based on the program progress state of the memory cells connected to the selected word line. For example, at a beginning of a program progress, the current sensing operation and the operation of applying the program pulse may be simultaneously performed to shorten the entire program time. However, as the program progress progresses or in a latter part of the program progress, the current sensing operation and the operation of applying the program pulse may be sequentially performed to prevent an unnecessary program pulse from being applied to the selected word line.

For example, when the program progress state (program progress) of the selected memory cells corresponds to a "first state (first phase)", the current sensing operation and the operation of applying the program pulse may be simultaneously performed. The first state may correspond to an early phase of the program operation, including the first program loop among a plurality of program loops. On the other hand, when the program progress state of the selected memory cells corresponds to a "second state (second phase)" that occurs after the first state, the current sensing operation and the operation of applying the program pulse may be sequentially performed. The second state may correspond to a final phase of the program operation, including the last loop immediately before the completion of the program among the plurality of program loops.

An example of an embodiment of step S150 will be described with reference to FIGS. 11 and 15.

In step S170, it is determined whether the program is completed. As a result of performance of step S150, when the verification is passed with respect to all target program states (S170: Yes), since the program is successfully completed, the program operation may be ended. As a result of the performance of step S150, when the verification is failed with respect to at least some target program states, the method may proceed to step S150 again and the program loop may be repeatedly performed.

Figure 11:
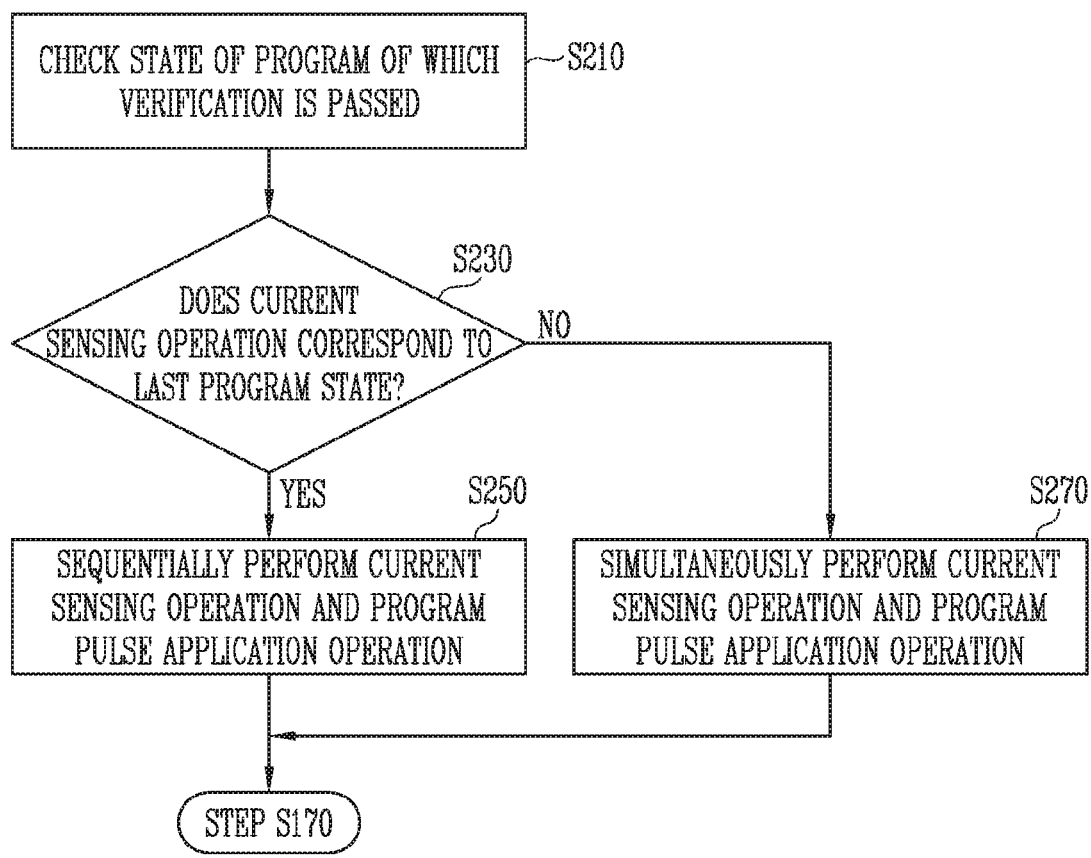
FIG. 11 is a flowchart illustrating an example of an embodiment of step S150 of FIG. 10.

FIG. 11 is a flowchart illustrating an example of an embodiment of step S150 of FIG. 10.

Referring to FIG. 11, first, a state of a program of which the verification is passed is checked (S210). In step S210, the state of the program of a target on which a present current sensing operation is performed may be determined by checking the program state of which the verification is passed so far. For example, when verification of the first to third target program states P1 to P3 among the first to seventh target program states P1 to P7 are passed, the current sensing operation CSC4 on the fourth target program state P4 may be required to be performed. As another example, when verification of the first to sixth target program states P1 to P6 among the first to seventh target program states P1 to P7 are passed, the current sensing operation CSC7 on the seventh target program state P7, which is the last program state, may be required to be performed. In the present specification, the "last program state" refers to a target program state corresponding to the highest threshold voltage among the plurality of target program states P1 to P7, that is, the seventh target program state P7.

In step S230, it is determined whether the current sensing operation corresponds to the last program state. As described above, when the verification of the first to third target program states P1 to P3 among the first to seventh target program states P1 to P7 are passed, since the current sensing operation corresponds to the fourth target program state P4, the current sensing operation does not correspond to the last program state (S230: No). As another example, when the verification of the first to sixth target program states P1 to P6 among the first to seventh target program states P1 to P7 are passed, the current sensing operation CSC7 on the seventh target program state P7, which is the last program state, is required to be performed, the current sensing operation corresponds to the last program state (S230: Yes). That is, in the embodiment of FIG. 11, when the current sensing operation does not correspond to the last program state, the program progress state (program progress) may correspond to the "first state (first phase)" described above. On the other hand, when the current sensing operation corresponds to the last programmed state, the program progress state may correspond to the "second state (second phase)" described above.

When the current sensing operation corresponds to the last program state (S230: Yes), this means that the program operation enters a final stage. Therefore, in this case, the current sensing operation and the operation of applying the program pulse are sequentially performed (S250). Therefore, when the verification of the current sensing operation CSC7 corresponding to the last program state (for example, P7) is passed, an unnecessary program pulse may be prevented from being applied to the selected word line. A detailed embodiment of step S250 will be described later with reference to FIG. 12.

When the current sensing operation does not correspond to the last program state (S230: No), this means that the program operation does not yet enter the final stage. Therefore, in this case, the current sensing operation and the operation of applying the program pulse are simultaneously performed (S270). Therefore, the entire program time may be shortened. A detailed embodiment of step S270 will be described later with reference to FIG. 13.

After step S250 or step S270 is performed, the method proceeds to step S170 of FIG. 10. Accordingly, when the program is completed according to performance of step S250 or step S270 (S170: Yes), the entire program operation is ended. When the program is not completed according to the performance of step S250 or step S270 (S170: No), the method proceeds to step S150 and perform a subsequent program loop.

As shown in FIG. 11, according to the program method of the semiconductor memory device according to another embodiment of the present disclosure, the current sensing operation and the operation of applying the program pulse are sequentially or simultaneously performed according to whether the current sensing operation corresponds to the last program state by checking the state of the program of which the verification is passed. Therefore, when the program operation enters the final stage, the current sensing operation and the operation of applying the program pulse are sequentially performed to prevent the application of the unnecessary program pulse. When the program operation does not yet enter the final stage, the current sensing operation and the operation of applying the program pulse are simultaneously performed to reduce the program time. Therefore, the entire program speed may be improved and the stability of the program operation may also be improved.

Figure 12:
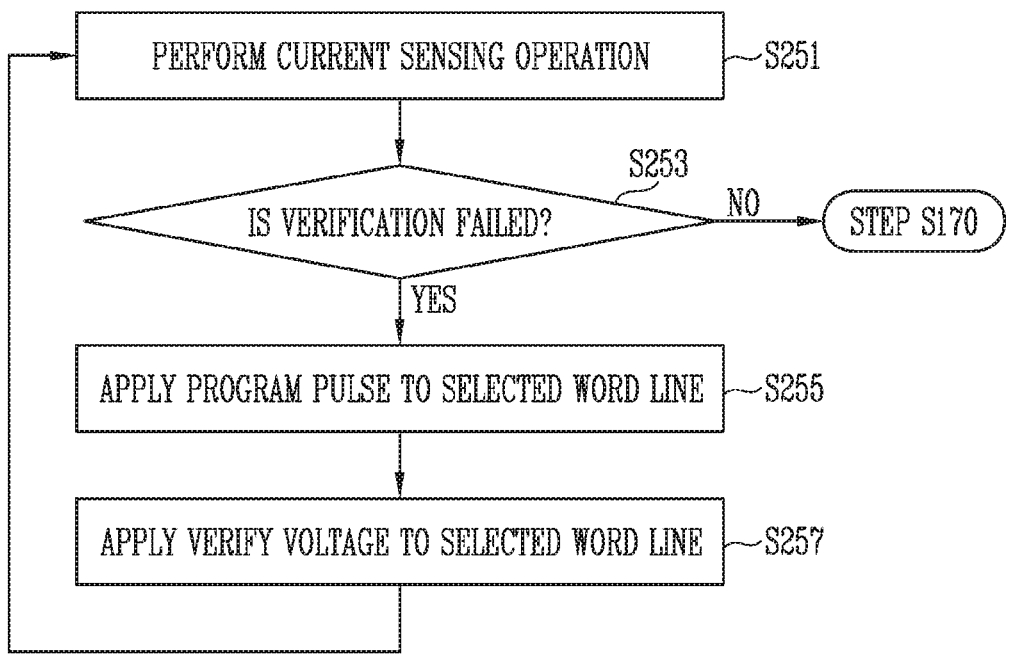
FIG. 12 is a flowchart illustrating an embodiment of step S250.

FIG. 12 is a flowchart illustrating an embodiment of step S250. That is, FIG. 12 shows a flowchart illustrating an embodiment in which the current sensing operation and the operation of applying the program pulse are sequentially performed when the current sensing operation corresponds to the last program state as a result of the determination of step S230.

Referring to FIG. 12, first, the current sensing operation is performed (S251). Since steps of FIG. 12 are performed when the current sensing operation corresponds to the last program state as a result of the determination of step S230, the current sensing operation CSC7 on the seventh target program state P7 may be performed in step S251.

Thereafter, in step S253, it is determined whether or not the verification of the seventh target program state P7 is failed. When the verification is passed with respect to the seventh target program state P7 (S253: No), the method proceeds to step S170 to determine whether the program is completed. Since the verification for the seventh target program state P7 is passed, this means that the program is completed (S170: Yes), and thus the program operation may be ended.

When the verification is failed with respect to the seventh target program state P7 (S253: Yes), a subsequent program loop may be required to be performed. Therefore, the program pulse is applied to the selected word line (S255), and the verify voltage is applied to the selected word line (S257). In step S257, the seventh verify voltage VR7 may be applied to the selected word line.

Thereafter, the method proceeds to step S251 again to perform the current sensing operation and performs step S253. Such a process is repeated until the verification of the seventh target program state P7 is passed (S253: No).

Referring to FIG. 12, after the current sensing operation is first performed (S251), it may be determined whether the verification is failed (S253), and when the verification is failed (S253: Yes), a subsequent program pulse may be applied to the selected word line (S255). That is, the current sensing operation and the operation of applying the program pulse are sequentially performed. Accordingly, when the verification of the seventh target program state P7 is passed, the method directly proceeds to step S170 to end the program operation, and an unnecessary program pulse is not applied.

Figure 13:
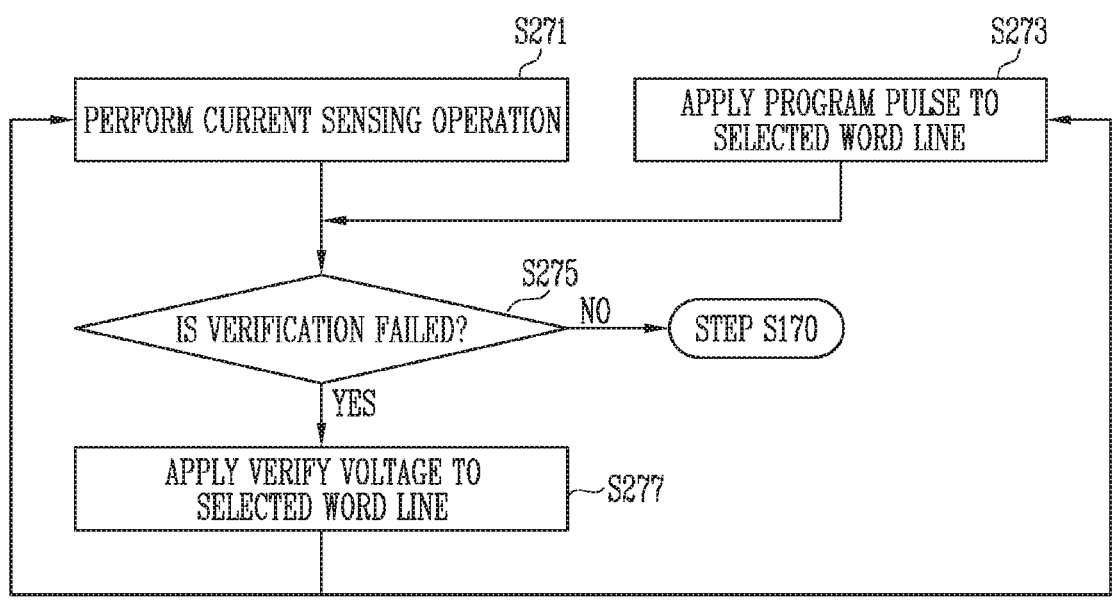
FIG. 13 is a flowchart illustrating an embodiment of step S270.

FIG. 13 is a flowchart illustrating an embodiment of step S270. That is, FIG. 13 shows a flowchart illustrating an embodiment in which the current sensing operation and the operation of applying the program pulse are simultaneously performed when the current sensing operation does not correspond to the last program state as a result of the determination of step S230.

Referring to FIG. 13, the current sensing operation is performed (S271), and at the same time, the program pulse is applied to the selected word line (S273). Since steps of FIG. 13 are performed when the current sensing operation does not correspond to the last program state as a result of the determination of step S230, in step S271, the current sensing operation on any one of the first to sixth target program states P1 to P6 may be performed. For example, the current sensing operation CSC3 on the third target program state P3 may be performed.

Thereafter, in step S275, for example, it is determined whether verification for the third target program state P3 is failed. When the verification is passed with respect to the third target program state P3 (S275: No), the method proceeds to step S170 to determine whether the program is completed. Even though the verification for the third target program state P3 is passed, since verification for the fourth to seventh target program states P4 to P7 is not passed, the method may proceed to step S150 again to perform subsequent program loops. In this case, the current sensing operation CSC4 on the fourth target program state P4 may be performed.

When the verification is failed with respect to the third target program state P3 (S275: Yes), a subsequent program loop may be required to be performed. Therefore, the verify voltage is applied to the selected word line (S277). In step S277, for example, verify voltages including at least the third verify voltage VR3 may be applied to the selected word line.

Thereafter, the method proceeds to step S271 and step S273 again to perform the current sensing operation and the program pulse application operation, respectively, and performs step S275. Such a process is repeated, for example, until the verification of the third target program state P3 is passed (S275: No).

Referring to FIG. 13, the current sensing operation (S271) and the operation of applying the program pulse to the selected word line (S273) are simultaneously performed. Thereafter, it may be determined whether the verification failed (S275), and when the verification is failed (S275: Yes), the verify voltage may be applied to the selected word line (S277). That is, the current sensing operation and the operation of applying the program pulse are simultaneously performed. That is, when the current sensing operation on the first to sixth target program states P1 to P6 is performed, the operation of applying the program pulse belonging to the subsequent program loop may be simultaneously performed, thereby reducing the entire program time.

Figure 14:
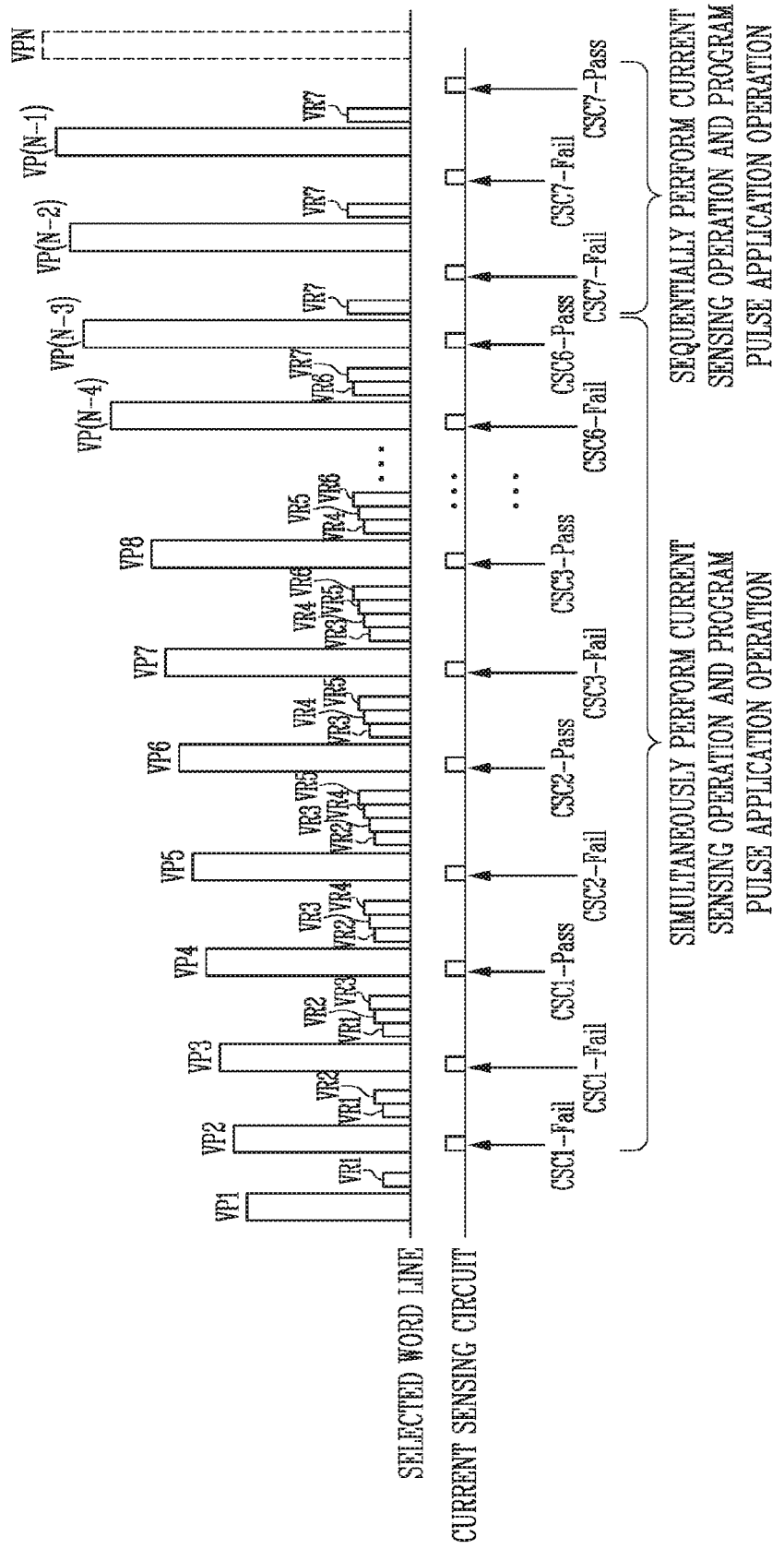
FIG. 14 is a diagram illustrating the program method described with reference to FIGS. 11 to 13.

FIG. 14 is a diagram illustrating the program method described with reference to FIGS. 11 to 13. Referring to FIG. 14, the program operation is performed in the same manner as shown in FIG. 9 until the verification is passed as a result of the current sensing operation CSC6 on the sixth target program state P6. That is, since the program operation is performed in the same manner as shown in FIG. 9 from the first to the (N−4)-th program loops, repetitive description will be omitted.

In FIG. 14, applying the first program pulse VP1 in the first program loop corresponds to step S110 of FIG. 10, and applying the first verify voltage VR1 corresponds to step S130 of FIG. 10. Thereafter, a step from performing the current sensing operation CSC1 on the first target program state P1 belongs to step S150 of FIG. 10.

While the first to (N−4)-th program loops are repeatedly performed, since the current sensing operation does not correspond to the last program state as a result of the determination of step S230 of FIG. 11 (S230: No), the method proceeds to step S270. In step S270, the current sensing operation and the operation of applying the program pulse are simultaneously performed. That is, while the first to (N−4)-th program loops are performed, the current sensing operation (S271) and the operation of applying the program pulse (S273) are simultaneously performed, and then it is determined whether the verification is failed (S275).

In FIG. 14, the current sensing operation CSC6 on the sixth target program state P6 is performed in the (N−4)-th program loop. At the same time, an (N−3)-th program pulse VP(N-3) is applied to the selected word line. According to FIG. 14, since the verification is passed as a result of performing the current sensing operation CSC6 on the sixth target program state P6 in the (N−4)-th program loop, a target of the current sensing operation is now the seventh target program state P7, which is the last program state. Accordingly, as a result of the determination of step S230 of FIG. 11, the current sensing operation corresponds to the last program state (S230: Yes), and the method proceeds to step S250. In step S250, the current sensing operation and the operation of applying the program pulse are sequentially performed. That is, from the (N−3)-th program loop, the current sensing operation (CSC7) and the subsequent operation of applying the program pulse are sequentially performed. When the verification is passed as a result of the current sensing operation CSC7 on the seventh target program state P7, the program operation is ended without a subsequent operation of applying the program pulse.

That is, the current sensing operation CSC7 on the seventh target program state P7 is performed after the verify voltage VR7 is applied in the (N−1)-th program loop (S251), since the verification is passed (S253: No), the method proceeds to step S170 to determine the completion of the program, and the entire program operation is ended. Therefore, apart from the embodiment shown in FIG. 9, according to the program method shown in FIG. 14, an unnecessary N-th program pulse VPN is not applied.

Figure 15:
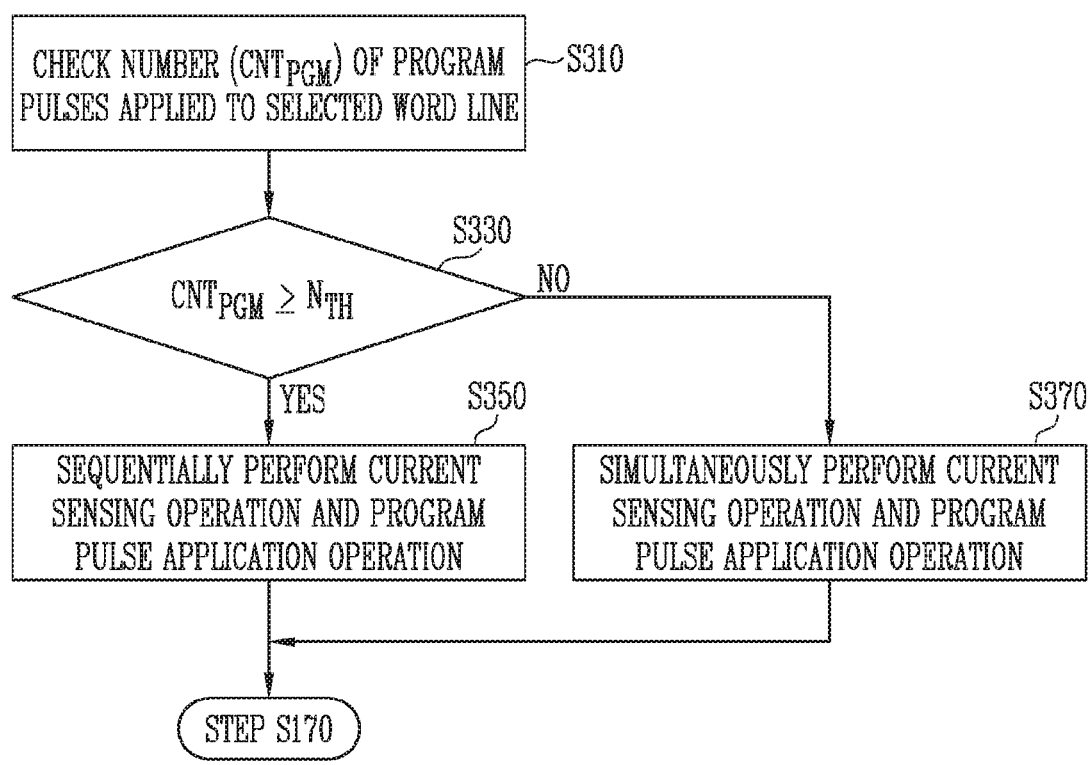
FIG. 15 is a flowchart illustrating another embodiment of step S150 of FIG. 10.

FIG. 15 is a flowchart illustrating another embodiment of step S150 of FIG. 10.

Referring to FIG. 15, the number $CNT_{PGM}$ of program pulses applied to the selected word line is checked (S310). The number $CNT_{PGM}$ of program pulses applied to the selected word line is the number of times the program pulses are applied to the selected word line after the program operation on the memory cells connected to the selected word line is started, and corresponds to the number of program loops. For example, when the program pulse is applied up to the fifth program pulse as a result of performance of step S310, the checked number $CNT_{PGM}$ of application of the program pulse may be five.

Thereafter, in step S330, the number $CNT_{PGM}$ of application of the program pulse is compared with a predetermined threshold number $N_{TH}$. The threshold number $N_{TH}$ may be determined experimentally. For example, when the entire program operation is completed when the program pulse is applied 20 times on average as a result of repeated experiments, the threshold number $N_{TH}$ may be determined to be a somewhat smaller value. For example, the threshold number $N_{TH}$ may be determined as 18 or 19. However, this is an example, and another value may be determined as the threshold number $N_{TH}$ as necessary. The word "predetermined" as used herein with respect to a parameter, such as a predetermined threshold number, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In the embodiment of FIG. 15, when the number $CNT_{PGM}$ of application of the program pulse is less than the threshold number $N_{TH}$, the program progress state (program progress) may correspond to the above-described "first state (first phase)". On the other hand, when the number $CNT_{PGM}$ of application of the program pulse is equal to or greater than the threshold number $N_{TH}$, the program progress state may correspond to the above-described "second state (first phase)".

When the number $CNT_{PGM}$ of application of the program pulse is equal to or greater than the threshold number $N_{TH}$ (S330: Yes), this means that the program operation enters the final stage. Therefore, in this case, the current sensing operation and the operation of applying the program pulse are sequentially performed (S350). Therefore, an unnecessary program pulse may be prevented from being applied to the selected word line at the final stage of the program operation. Step S350 may be configured as the embodiment shown in FIG. 12.

When the number $CNT_{PGM}$ of application of the program pulse is less than the threshold number $N_{TH}$, (S330: No), this means that the program operation does not yet enter the final stage. Therefore, in this case, the current sensing operation and the operation of applying the program pulse are simultaneously performed (S370). Therefore, the entire program time may be shortened. Step S370 may be configured as the embodiment shown in FIG. 13.

After step S350 or step S370 is performed, the method proceeds to step S170 of FIG. 10. Accordingly, when the program is completed according to performance of step S350 or step S370 (S170: Yes), the entire program operation is ended. When the program is not completed according to the performance of step S350 or step S370 (S170: No), the method proceeds to step S150 to perform a subsequent program loop.

As shown in FIG. 15, according to the program method of the semiconductor memory device according to another embodiment of the present disclosure, the number $CNT_{PGM}$ of program pulses applied to the currently selected word line is checked, and the current sensing operation and the operation of applying the program pulse are sequentially or simultaneously performed according to whether the number $CNT_{PGM}$ of applied program pulses is less than the threshold number $N_{TH}$. Therefore, when the program operation enters the final stage, the current sensing operation and the operation of applying the program pulse are sequentially performed to prevent the application of the unnecessary program pulse. When the program operation does not yet enter the final stage, the current sensing operation and the operation of applying the program pulse are simultaneously performed to reduce the program time. Therefore, the entire program speed may be improved and the stability of the program operation may also be improved.

Figure 16:
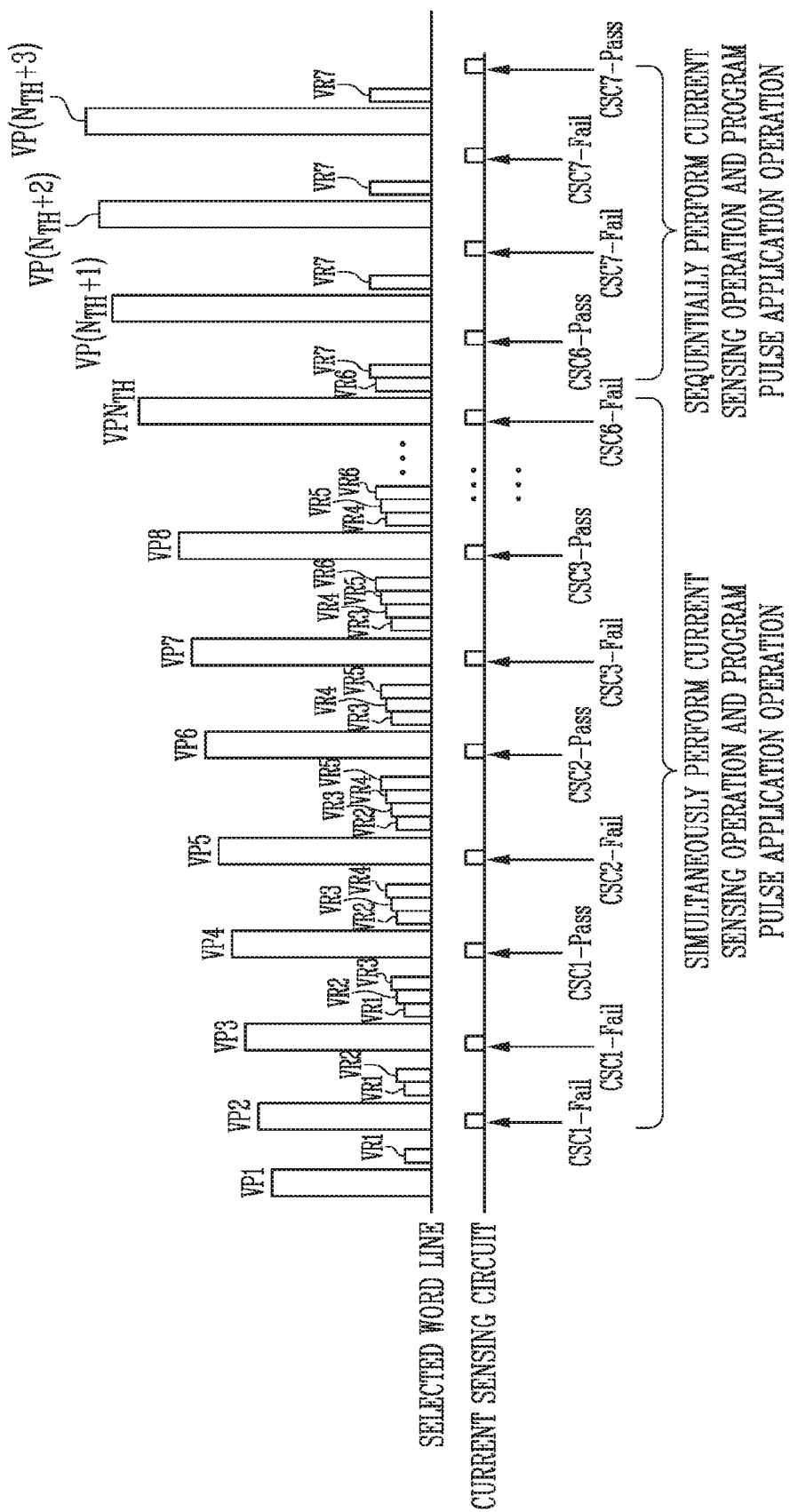
FIG. 16 is a diagram illustrating the program method described with reference to FIG. 15.

FIG. 16 is a diagram illustrating the program method described with reference to FIG. 15.

Referring to FIG. 16, when the number of application of the program pulse is less than the threshold value $N_{TH}$, the program operation is performed in the same manner as shown in FIG. 9. That is, since the program operation is performed in the same manner as shown in FIG. 9 until first to ($N_{TH}$−1)-th program loops, repetitive description will be omitted.

In FIG. 16, applying the first program pulse VP1 in the first program loop corresponds to step S110 of FIG. 10, and applying the first verify voltage VR1 corresponds to step S130 of FIG. 10. Thereafter, a step from performing the current sensing operation CSC1 on the first target program state P1 belongs to step S150 of FIG. 10.

While the first to ($N_{TH}$–1)-th program loops are repeatedly performed, since the number $CNT_{PGM}$ of program pulses applied to the selected word line is less than the threshold number $N_{TH}$ as a result of the determination of step S330 of FIG. 15 (S330: No), the method proceeds to step S370. In step S370, the current sensing operation and the operation of applying the program pulse are simultaneously performed. That is, while the first to ($N_{TH}$–1)-th program loops are performed, the current sensing operation (S271) and the operation of applying the program pulse (S273) are simultaneously performed, and then it is determined whether the verification is failed (S275).

In FIG. 16, the current sensing operation CSCE on the sixth target program state P6 is performed in the ($N_{TH}$–1)-th program loop. At the same time, an (N)-th program pulse $VPN_{TH}$ is applied to the selected word line. Accordingly, since the number $CNT_{PGM}$ of program pulses applied to the selected word line is equal to the threshold number $N_{TH}$ as a result of the determination of step S330 (S330: Yes), the method proceeds to step S350. Accordingly, in step S350, the current sensing operation and the operation of applying the program pulse are sequentially performed. That is, from the N-th program loop, the current sensing operation CSC7 and the subsequent operation of applying the program pulse are sequentially performed. When the verification is passed as a result of the current sensing operation CSC7 on the seventh target program state P7, the program operation is ended without a subsequent operation of applying the program pulse.

That is, the current sensing operation CSC7 on the seventh target program state P7 is performed after the verify voltage VR7 is applied in the ($N_{TH}$+3)-th program loop (S251), since the verification is passed (S253: No), the method proceeds to step S170 to determine the completion of the program, and the entire program operation is ended. Therefore, differently from the embodiment shown in FIG. 9, according to the program method shown in FIG. 16, an unnecessary ($N_{TH}$+4)-th program pulse is not applied.

Figure 17:
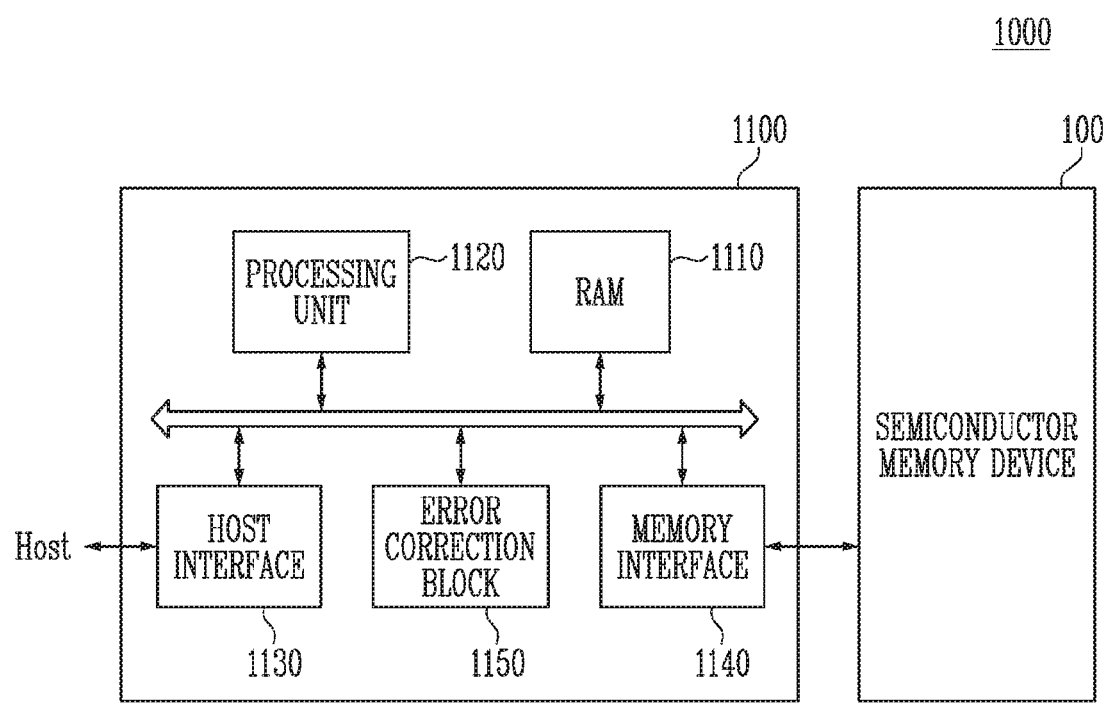
FIG. 17 is a block diagram illustrating an embodiment of a memory system including the semiconductor memory device of FIG. 1.

FIG. 17 is a block diagram illustrating an embodiment of a memory system 1000 including the semiconductor memory devices of FIG. 1.

Referring to FIG. 17, the memory system 1000 includes the semiconductor memory device 100 and the controller 1100. The semiconductor memory device 100 may be the semiconductor memory devices described with reference to FIG. 1. Hereinafter, repetitive description is omitted.

The controller 1100 is connected to the host Host and the semiconductor memory device 100. The controller 1100 is configured to access the semiconductor memory device 100 in response to the request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as any one of an operation memory of the processing unit 1120, a cache memory between the semiconductor memory device 100 and the host Host, and a buffer memory between the semiconductor memory device 100 and the host Host. The processing unit 1120 controls overall operations of the controller 1100. In addition, the controller 1100 may temporarily store program data provided from the host Host during the write operation.

The host interface 1130 includes a protocol for performing data exchange between the host Host and the controller 1100. As an example of an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface includes a NAND interface or a NOR interface.

The error correction block 1150 is configured to detect and correct an error of data received from the semiconductor memory device 100 using an error correcting code (ECC). The processing unit 1120 may control the read voltage according to an error detection result of the error correction block 1150 and control the semiconductor memory device 100 to perform re-reading. As an example of an embodiment, the error correction block may be provided as a component of the controller 1100.

The controller 1100 and the semiconductor memory device 100 may be integrated into one semiconductor device. As an example of an embodiment, the controller 1100 and the semiconductor memory device 100 may be integrated into one semiconductor device to configure a memory card. For example, the controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host Host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an example of an embodiment, the semiconductor memory device 100 or the memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 18:
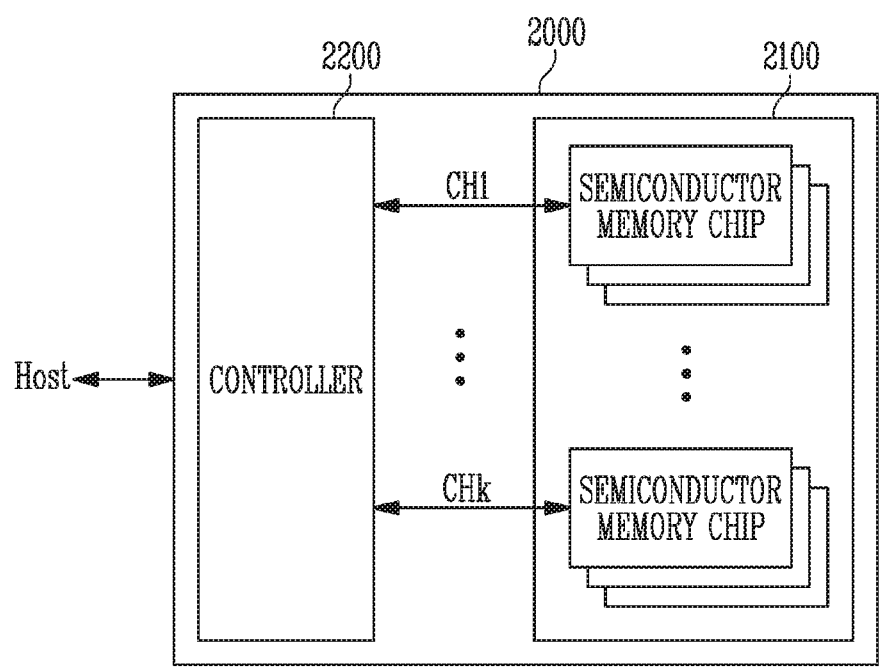
FIG. 18 is a block diagram illustrating an application example of the memory system of FIG. 17.

FIG. 18 is a block diagram illustrating an application example of the memory system of FIG. 17.

Referring to FIG. 18, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 18, the plurality of groups communicate with the controller 2200 through first to k-th channels CH1 to CHk, respectively. Each semiconductor memory chip is configured and is operated similarly to one of the semiconductor memory devices 100 described with reference to FIG. 1.

Each group is configured to communicate with the controller 2200 through one common channel. The controller 2200 is configured similarly to the controller 1100 described with reference to FIG. 17 and is configured to control the plurality of memory chips of the semiconductor memory device 2100 through the plurality of channels CH1 to CHk.

Figure 19:
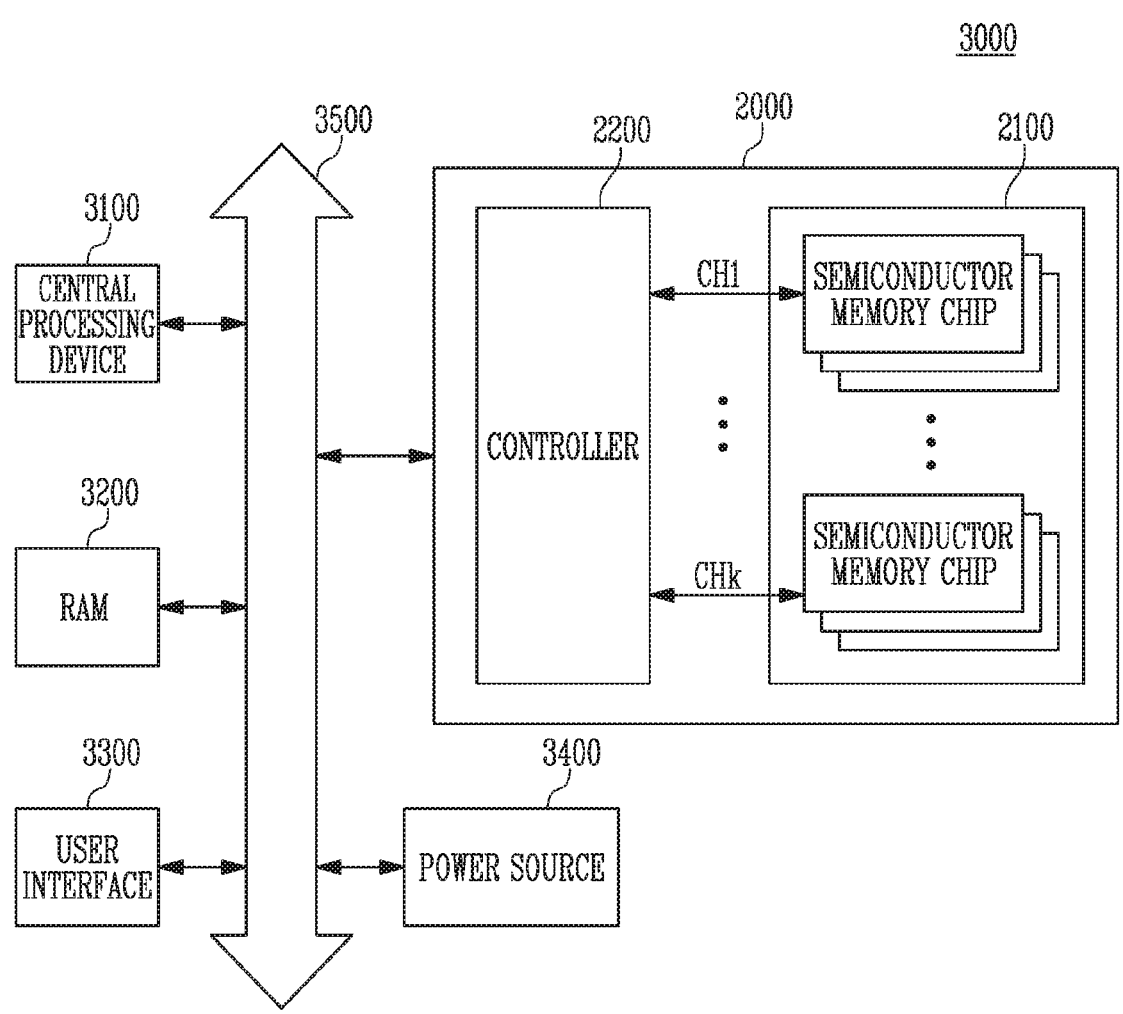
FIG. 19 is a block diagram illustrating a computing system including the memory system described with reference to FIG. 18.

FIG. 19 is a block diagram illustrating a computing system including the memory system described with reference to FIG. 18.

The computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 19, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 19, the memory system 2000 described with reference to FIG. 18 is provided. However, the memory system 2000 may be replaced with the memory system 1000 described with reference to FIG. 17. As an example of an embodiment, the computing system 3000 may be configured to include both of the memory systems 1000 and 2000 described with reference to FIGS. 17 and 18.

The embodiments of the present disclosure disclosed in the present specification and drawings are merely examples for describing the technical content of the present disclosure and facilitating understanding of the present disclosure and do not limit the scope of the present disclosure. It will be apparent to a person skilled in the art to which the present disclosure pertains that other modifications based on the technical spirit of the present disclosure may be carried out in addition to the embodiments disclosed herein.

What is claimed is:

1. A semiconductor memory device comprising:
a memory cell array including a plurality of memory cells;
a peripheral circuit configured to perform a program operation on selected memory cells connected to a selected word line among the plurality of memory cells;
a current sensing circuit configured to generate a pass signal or a fail signal by performing a current sensing operation on the selected memory cells; and
control logic configured to receive the pass signal or the fail signal and control an operation of the peripheral circuit and the current sensing circuit,
wherein the control logic controls the current sensing circuit and the peripheral circuit to perform the current sensing operation and an operation of applying a program pulse to the selected word line based on a program progress state of the selected memory cells,
wherein when the program progress state of the selected memory cells corresponds to a first state that includes a first program loop among a plurality of program loops, the control logic controls the current sensing circuit and the peripheral circuit to simultaneously perform the current sensing operation and the operation of applying the program pulse to the selected word line, and wherein when the program progress state of the selected memory cells corresponds to a second state that includes a last program loop among the plurality of program loops, the control logic controls the current sensing circuit and the peripheral circuit to sequentially perform the current sensing operation and the operation of applying the program pulse to the selected word line.

2. The semiconductor memory device of claim 1, wherein the selected memory cells are programmed to any one of a plurality of target program states, and
when the current sensing operation to be performed corresponds to any one of remaining target program states except for a last program state among the plurality of target program states, the control logic controls the current sensing circuit and the peripheral circuit to simultaneously perform the current sensing operation and the operation of applying the program pulse to the selected word line.

3. The semiconductor memory device of claim 1, wherein when the number of program pulses applied to the selected word line is less than a predetermined threshold number, the control logic controls the current sensing circuit and the peripheral circuit to simultaneously perform the current sensing operation and the operation of applying the program pulse to the selected word line.

4. The semiconductor memory device of claim 1, wherein the selected memory cells are programmed to any one of a plurality of target program states, and
when the current sensing operation to be performed corresponds to a last program state among the plurality of target program states, the control logic controls the current sensing circuit to perform the current sensing operation, and then controls the peripheral circuit to perform the operation of applying the program pulse to the selected word line.

5. The semiconductor memory device of claim 1, wherein when the number of program pulses applied to the selected word line is equal to or greater than a predetermined threshold number, the control logic controls the current sensing circuit to perform the current sensing operation, and then controls the peripheral circuit to perform the operation of applying the program pulse to the selected word line.

6. The semiconductor memory device of claim 1, wherein the peripheral circuit comprises:
- an address decoder configured to decode the selected word line among a plurality of word lines connected to the memory cell array and transfer a program voltage and a verify voltage to the selected word line; and
- a read and write circuit connected to the memory cell array through a plurality of bit lines and configured to transfer a program permission voltage or a program inhibit voltage to each of the plurality of bit lines.

7. A method of operating a semiconductor memory device for programming selected memory cells, the method comprising:
- applying a program pulse to a selected word line connected to the selected memory cells;
- applying a verify voltage to the selected word line; and
- performing a current sensing operation and an operation of applying a program pulse based on a program progress state for the selected memory cells,
- wherein when the program progress state of the selected memory cells corresponds to a first state that includes a first program loop among a plurality of program loops, the current sensing operation and the operation of applying the program pulse are simultaneously performed, and wherein when the program progress state of the selected memory cells corresponds to a second state that includes a last program loop among the plurality of program loops, the current sensing operation and the operation of applying the program pulse are sequentially performed.

8. The method of claim 7, wherein when the program progress state of the selected memory cells corresponds to the first state, the selected memory cells are programmed to any one of a plurality of target program states, and
performing the current sensing operation and the operation of applying the program pulse comprises:
- checking a program state of which a verification is passed among the plurality of target program states; and
- simultaneously performing the current sensing operation and the operation of applying the program pulse to the selected word line when the current sensing operation to be performed corresponds to any one of remaining target program states except for a last program state among the plurality of target program states.

9. The method of claim 7, wherein when the program progress state of the selected memory cells corresponds to the first state, performing the current sensing operation and the operation of applying the program pulse comprises:
- checking the number of program pulses applied to the selected word line; and
- simultaneously performing the current sensing operation and the operation of applying the program pulse to the selected word line when the number of the program pulses is less than a predetermined threshold number.

10. The method of claim 7, wherein when the program progress state of the selected memory cells corresponds to the first state, performing the current sensing operation and the operation of applying the program pulse comprises:
- performing the current sensing operation;
- applying the program pulse to the selected word line in a period at least partially overlapping a period in which the current sensing operation is performed; and
- determining whether a verification is failed or passed as a result of the current sensing operation.

11. The method of claim 7, wherein when the program progress state of the selected memory cells corresponds to the second state, the selected memory cells are programmed to any one of a plurality of target program states, and
performing the current sensing operation and the operation of applying the program pulse comprises:
- checking a program state of which a verification is passed among the plurality of target program states; and
- sequentially performing the current sensing operation and the operation of applying the program pulse to the selected word line when the current sensing operation to be performed corresponds to a last program state among the plurality of target program states.

12. The method of claim 7, wherein when the program progress state of the selected memory cells corresponds to the second state, performing the current sensing operation and the operation of applying the program pulse comprises:
- checking the number of program pulses applied to the selected word line; and
- sequentially performing the current sensing operation and the operation of applying the program pulse to the selected word line when the number of program pulses is equal to or greater than a predetermined threshold number.

13. The method of claim 7, wherein when the program progress state of the selected memory cells corresponds to the second state, performing the current sensing operation and the operation of applying the program pulse comprises:
- performing the current sensing operation;
- determining whether a verification is failed or passed as a result of the current sensing operation; and
- applying the program pulse to the selected word line when the verification is failed.

* * * * *